United States Patent [19]
Nossen et al.

[11] 3,984,771
[45] Oct. 5, 1976

[54] ACCURATE DIGITAL PHASE/FREQUENCY EXTRACTOR

[75] Inventors: Edward Joachim Nossen, Cherry Hill, N.J.; Eugene Richard Starner, Bethlehem, Pa.

[73] Assignee: RCA Corporation, New York, N.Y.

[22] Filed: Oct. 20, 1975

[21] Appl. No.: 624,308

[52] U.S. Cl. ............................. 324/83 D; 324/79 D; 328/14; 307/227
[51] Int. Cl.² .......................................... G01R 25/00
[58] Field of Search ....................... 324/83 D, 79 D; 307/227; 328/14, 186; 325/38 R; 235/150.53

[56] References Cited
UNITED STATES PATENTS

| | | | |
|---|---|---|---|
| 3,337,863 | 8/1967 | Lender | 325/38 R |
| 3,689,914 | 9/1972 | Butler | 328/14 |

*Primary Examiner*—R. V. Rolinec
*Assistant Examiner*—Michael J. Tokar
*Attorney, Agent, or Firm*—Edward J. Norton; Carl M. Wright

[57] ABSTRACT

Digital apparatus employing a direct frequency synthesizer for accurately measuring the phase difference between a received signal and a phase reference signal by calculating a coarse value based on the synthesizer's internal clock and subtracting therefrom a correction based on triangular relationships in the vicinity of the received signal's actual zero crossing point.

1 Claim, 6 Drawing Figures

ACCURATE DIGITAL PHASE/FREQUENCY EXTRACTOR

BACKGROUND OF THE INVENTION

The accurate measurement of the frequency and phase of received signals is important in systems such as radar range and range rate measurement, navigation, and collision avoidance systems. It is also useful in communication systems for extracting bit timing information to permit synchronous detection of digital data streams.

Phase locked oscillators (PLO) provide the preferred techniques for producing accurate measurement of phase and frequency. Basically, a phase locked oscillator compares the phase of an input signal to the phase of a voltage controlled oscillator (VCO). The resultant phase difference modifies the control voltage of the VCO to change its frequency in a direction that reduces the phase difference.

The accuracy of a PLO can be increased by using digital techniques. The accuracy of a digital system increases with the number of bits used. Frequency limitations are imposed, however, by the speed of the digital devices employed in the system.

An important component of the digital PLO systems is the generation of a frequency which is controlled by a digital number. The digital number is usually a function of the phase difference between the VCO output signal and the received signal. Comparison of the various available techniques is more clear when applied to a specific example. In the discussion below, a doppler frequency extractor will be used as the example. Doppler frequency shift is important in determining range rate and is the change of the input frequency from a transmitted or reference signal or from its previous value.

One PLO technique is Programmable-Divide-by-N in which the frequency of a reference oscillator is divided and compared to the divided phase difference between the received signal and the VCO output signal. Varying the division ratios varies the frequency of the VCO.

If the VCO frequency ($f_s$) is divided by $N$ and the reference frequency ($f_R$) is divided by $R$, then the VCO output frequency will be $$f_s = (N/R)f_R.$$

Comparing the phase of the VCO output signal to the phase of the received signal produces a phase difference which is converted to a digital number by an analog-to-digital converter. The resulting digital number is $N$ and controls the frequency of the VCO to track the received signal. The value of $N$ will be proportional to the received frequency.

The required sampling rate ($f_R/R$) can be found for a given degree of accuracy in the measurement of doppler shift. Assuming a 19MHz transponder output frequency and letting $f_d/110.5$ represent the doppler shift on the 19MHz interface, $$19 \times 10^6 + f_d/110.5 = (N/R)f_R.$$

When $f_d$ is zero, $N$ will have a nominal value. Designating this value $N_o$, $$19 \times 10^6 + f_d/110.5 = (N_o + n)f_R/R$$

where $n$ is the change in $N_o$ required to track $f_d$. For an accuracy of 0.01Hz accuracy, a unit change in $n$, which is an integer, must result in a 0.01Hz change. Therefore, since $N_o(f_R/R) = 19 \times 10^6$, $$f_d/110.5 = n(f_R/R)$$

and for $n = 1$ and $fd = 0.01$Hz, $$f_R/R = 10^{-4} \text{Hz}.$$

The low pass filter which couples the comparator output signal to the VCO must limit the passed frequencies to approximately one-tenth the sampling frequency to suppress incidental frequency modulation at the sampling frequency. In the above example, the bandwidth of the filter would be approximately $10^{-5}$Hz which is prohibitively narrow for implementation and for requirements of initial acquisition and tracking of doppler rates. Furthermore, frequency variations in the VCO would prevent the system from remaining locked to $f_R/R$.

Averaging the value of $n$ over several samples will not improve the resolution because $n$ will not change faster than $R/f_R$, which is $10^4$ seconds (2 hours, 46 minutes, 40 seconds) in the above example.

This technique requires at least a 30-bit divider, the minimum attained by translating the 19MHz interface to only 100KHz.

For the above reasons, a programmable divider PLO has serious limitations of accuracy.

A second technique, called Iterative Synthesizing, combines frequencies obtained by division of reference frequencies. The combinations are controlled by a digital number so that the resulting output frequency is proportional to the digital number.

Practical iterative synthesizers have high resolution, wide tuning range, and high spectral purity. The system, however, requires a large amount of hardware. A system having the resolution of 0.01Hz discussed in the above example would require 12 mixers, five different input frequencies each with a fixed frequency synthesizer, 48 frequency selection switches or gates, and 24 low-pass filters.

A third PLO technique uses an Incremental Phase Modulator to generate a controlled frequency offset from a given reference frequency. The offset is controlled by a digital number. An example of the implementation of this technique would be a tapped delay line, the output signal from each tap coupled to a gate which is enabled by one of the bits in the controlling digital number. The output signals from all the gates would be combined in a mixer to produce the output frequency. This implementation is called a Serradyne. The frequency at which this technique operates is determined by the number of taps, phase quantization, and the stability of the tapped delay line. The complexity of the implementation makes this technique unattractive for high resolution systems.

A fourth PLO technique, which is sometimes referred to as direct synthesization, employs an arithmetic synthesizer to construct a sine wave signal by accumulation of the digital number. A VCO is not used in this technique; the output signal is synthesized by the accumulator. An example of a direct arithmetic synthesizer can be found in U.S. Pat. No. 3,689,914 (Butler), assigned to the same assignee as this application. An example of the use of an arithmetic synthesizer used in a locked loop can be found in application Ser. No. 609,004, assigned to the same assignee as this application. In this technique, the digital number is added into an accumulator periodically in response to a clock signal. The accumulator contents increase linearly until the capacity of the accumulator is exceeded. At this point, the accumulator overflows and begins to increase linearly again. The successive numbers in the accumulator, if plotted graphically, represent a sawtooth waveform. Successive carries from the accumulator can be used to complement the accumulator's output signal which results in a step-wise triangular wave shape. This waveform (or the sawtooth) can be filtered to extract the fundamental frequency. By filtering out the step levels, a relatively pure sine wave can be generated.

If the accumulator capacity is designated $N_c$, the synthesized frequency is $$f_s = (N_R/N_c)f_o,$$

where $N_R$ = register (frequency) number (controlling digital number), and $f_o$ = frequency of the clock signal.

Multiplying the synthesized output signal by $K$ before applying it to the phase comparator reduces the synthesizer frequency and the frequency requirements of the clock signal for a given VCO frequency. The reduction of the clock frequency is necessary at high frequencies because of the limitations imposed by the adder speed. The value of $K$ is referred to as the frequency multiplying ratio. The synthesized frequency is $$f_s = K(N_R/N_c)f_o.$$

Since $N_R$, $N_c$, and $K$ are integers, only discrete frequencies can be generated for a fixed clock frequency. The accuracy can be selected by proper selection of the multiplying ratio, the accumulator capacity, and the clock frequency. With $N_c$, $f_o$, and $K$ fixed, the smallest change in output frequency is the result of a unit change in the digital number, $N_R$. Therefore, $$\Delta f_s = Kf_o/N_c.$$

For a transponder interface frequency of 76MHz, a clock frequency of 5MHz, and a synthesizer output frequency of 1MHz, the value of the multiplier ratio is 76. For a 0.01Hz frequency change in the S-band, or a $3.62 \times 10^{-4}$Hz change at 76MHz, the accumulator capacity is calculated by $$3.62 \times 10^{-4} = 76 \times 5 \times 10^6/N_c.$$

Therefore, $$N_c = 1.05 \times 10^{12}$$

and the number of bits required is given by $$B_c = \log_2 N_c = 39.933$$

which indicates 40 bits are required.

The primary disadvantage of an arithmetic synthesizer is the inability to operate at high speed without using special logic circuits. Other problems are caused by spurious signals introduced by the accumulator overflows and quantization noise added by the finite resolution of the digital-to-analog converter that converts the digital number from the accumulator to the analog output signal.

The invention disclosed herein is a system implementation for extracting very accurate phase and frequency information from a received signal using a digital direct arithmetic synthesizer locked to the received signal through a wideband digital feedback loop.

BRIEF DESCRIPTION OF THE INVENTION

A system for measuring the phase difference between a reference signal and an input signal utilizes a direct frequency synthesizer with a coarse phase measurement based on the number of internal clock pulses occurring between the zero crossing of the reference signal and the clock signal occurring immediately after the zero crossing of the synthesized signal. The actual phase difference is derived by subtracting from the coarse measurement a fine measurement based on the time between the actual zero crossing of the synthesized signal and the next occurring internal clock pulse.

Figure 1:
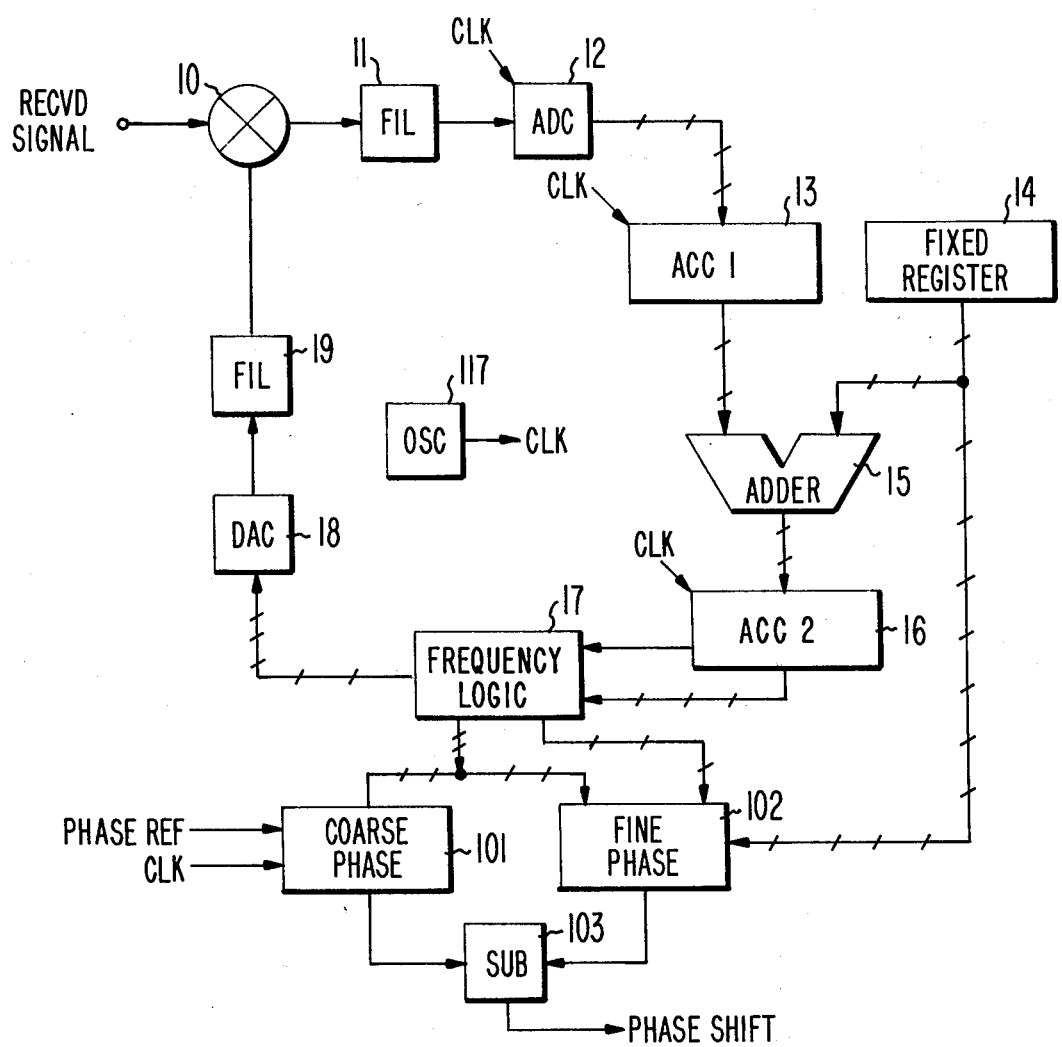
FIG. 1 is a block diagram of a preferred embodiment of the invention.

A preferred embodiment of the invention is shown in the block diagram of FIG. 1. The phase of the received signal is to be measured relative to a phase reference signal which has positive zero crossings coincident with certain internal clock pulses. That is, the phase reference signal must be related to the clock frequency by an integer or by a small integer ratio. The received signal is coupled to a phase comparator 10, whose other input signal is a synthesized signal which is described below. The output signal from the phase comparator is an analog signal proportional to the difference in the phase between the received signal and the synthesized signal and is passed through a filter 11 to provide an input signal to an analog-to-digital (A/D) converter 12. The output signal of the A/D converter 12 is an input signal to a first accumulator 13.

A digital accumulator is an operating device for adding an input digital signal to a stored digital signal in response to a control or clocking pulse. The output signal from the accumulator is the stored digital value, which is increased at each clocking pulse by an amount equal to the input signal. An accumulator can be assembled from commercially available devices. For example, an arithmetic-logic unit (ALU) such as an integrated circuit type SN74181 (Texas Instruments, Inc.) can be coupled to receive at one set of input terminals the input digital signal and, at the other set of input terminals, the stored digital signal. The output signals from the ALU can be coupled, each to a D-input terminal of a separate D-type flip-flop, each clock input signal of the flip-flops being coupled in common to the control or clocking pulse. Integrated circuits having a plurality of flip-flop stages with common clock signals are commercially available, e.g., type SN7475 (four stages) or SN74100 (eight stages) (Texas Instruments, Inc.). The output signals from the flip-flops are the stored digital value. The devices described can be cascaded to form digital words of any desired number of bits. For $n$ bits (stages), addition (or subtraction) is provided for ALU output values up to $2^n-1$. The ALU described can also, by means of function control signals, perform increment, decrement, subtract, complement, shift, AND, OR, Exclusive-OR, and various other specialized functions as described in the application notes therefor.

A fixed register 14 stores a digital value corresponding to the base or nominal frequency to be synthesized. The value in the fixed register 14 can be established by switches or some other similar device well known in the art. The output signals from the fixed register 14 and the first accumulator 13 provide input signals to an adder 15. The adder 15 can be a commercially available device such as described in the accumulator above. The output signal from the adder 15, i.e., the sum of the values from the fixed register 14 and the output signal value from the first accumulator 13, is applied to a second accumulator 16. The second accumulator 16 can be the same type as described for the first accumulator 13.

The output signal from the second accumulator 16 is a digital value (sum) and an overflow signal (carry) which are coupled to a frequency logic network 17. The output signal from the network 17 is a stepped sine wave which is converted to an analog signal by a digital-to-analog (D/A) converter 18. The output signal from the D/A converter 18 is passed through a filter 19 to produce a synthesized sine wave which is coupled to the phase comparator 10 as described above. The A/D converter 12, the first accumulator 13, and the second accumulator 16 are responsive to a system clock derived from an oscillator 117 which synchronizes the operation of the system. The generation of a synthesized frequency by use of an accumulator is shown in detail in U.S. Pat. No. 3,689,914.

Figure 2:
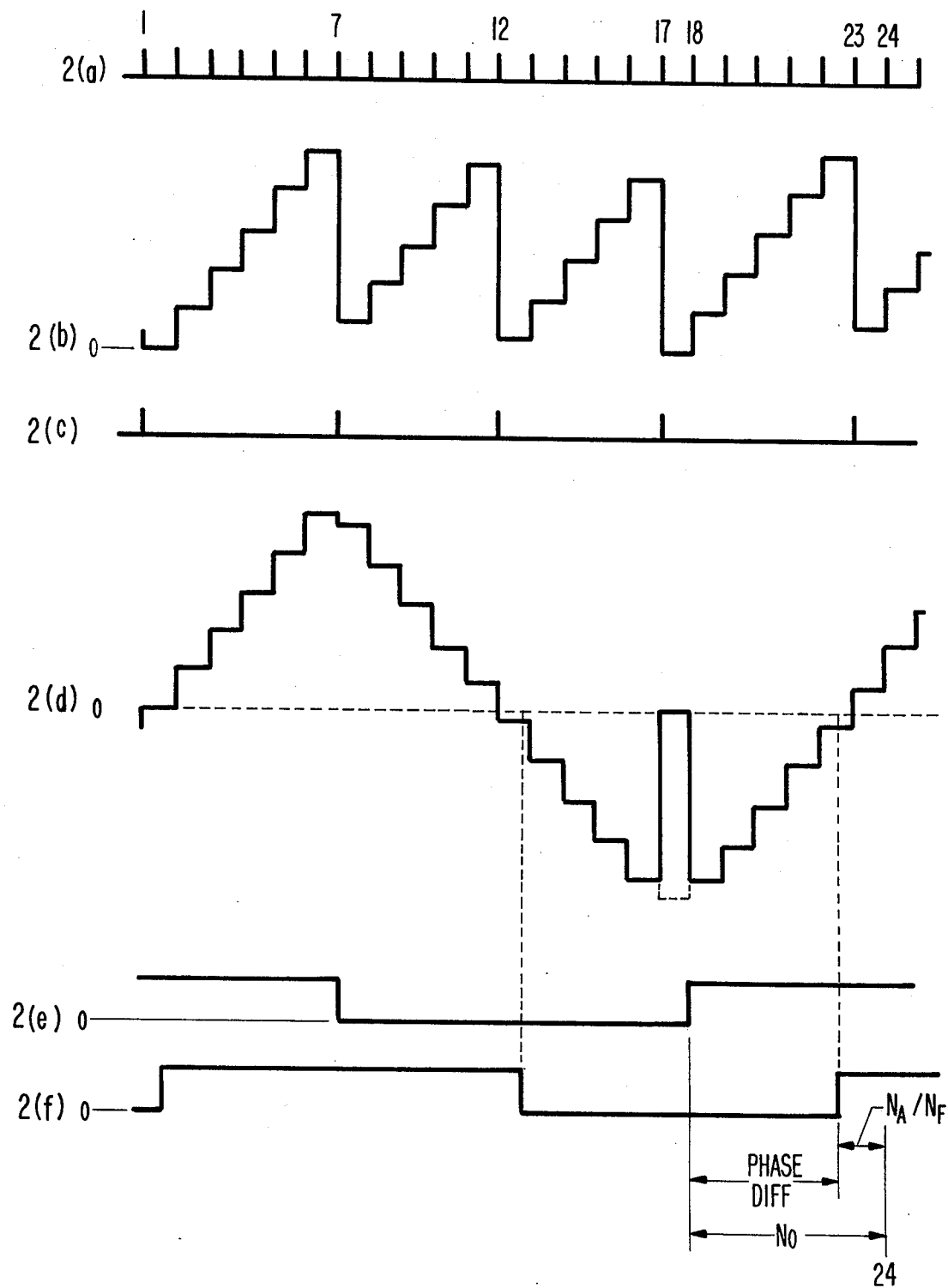
FIG. 2 is a timing diagram showing certain signals from the embodiment of FIG. 1.

While a typical fixed register 14 might contain forty stages and the first accumulator 13, approximately 12 stages, the principle of operation is explained below with fewer stages used as an illustrative example. The operation of the system of FIG. 1 can be more easily understood in conjunction with the timing diagrams in FIG. 2. FIG. 2($a$) represents the output signal from the oscillator 117, i.e., the internal clock pulses. FIG. 2($b$) represents the output signal value from the second accumulator 16. FIG. 2($c$) represents the second accumulator's overflow (carry out) signal. FIG. 2($d$) represents the output signal from the frequency logic network 17 to the D/A converter 18. As shown in FIG. 2($b$), the output value from the second accumulator 16 increases at each clock signal until an overflow is generated. In this example, a four-bit accumulator and a constant frequency number of 3, i.e., the output signal from the adder 15, are assumed. Each clock signal, therefore, adds three to the accumulator contents until an overflow occurs. The frequency logic network 17, in response to the overflow coincident with time pulse 7 complements the output value from the accumulator 16. In response to the next overflow signal, occurring at time pulse 12, the sign of the output value is changed but it is uncomplemented, and, in response to the next overflow signal at time pulse 17, the sign is maintained the same and the output is again complemented. At time pulse 23, the sign is changed and the cycle begins again with an uncomplemented value.

Figure 3:
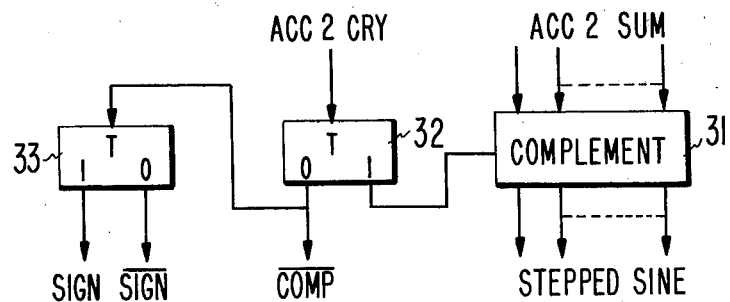
FIG. 3 is a block diagram of an embodiment of a frequency logic network.

FIG. 3 is a block diagram of an embodiment of the frequency network 17. The sum output signal from the second accumulator 16 is applied to a 2's-complementer 31. The carry signal is applied to a triggerable flip-flop 32 and the output signal from the reset side of the triggerable flip-flop 32 is coupled to the trigger of the sign flip-flop 33. The two's-complementer 31 produces the 2's-complement of the sum signal from the second accumulator 16 when the flip-flop 32 is in the set state. The flip-flops 32 and 33 operate as a scale-of-four counter. Both are reset at the beginning of the synthesized frequency cycle. At the first overflow, the flip-flop 32 is triggered to the set state, complementing the output signal from the accumulator 16. The following overflow signal triggers the flip-flop 32 to the reset state which in turn triggers the flip-flop 33 to the set state, changing the sign. The third overflow signal in the cycle triggers the flip-flop 32 to the set state, and the fourth overflow signal in the cycle triggers the flip-flop 32 to the reset state which in turn triggers the flip-flop 33 to the reset state. Therefore, the output signal from the frequency logic network 17 is the stepped sine wave which is applied to the D/A converter 18 and has a waveshape as represented in FIG. 2(d).

Figure 4:
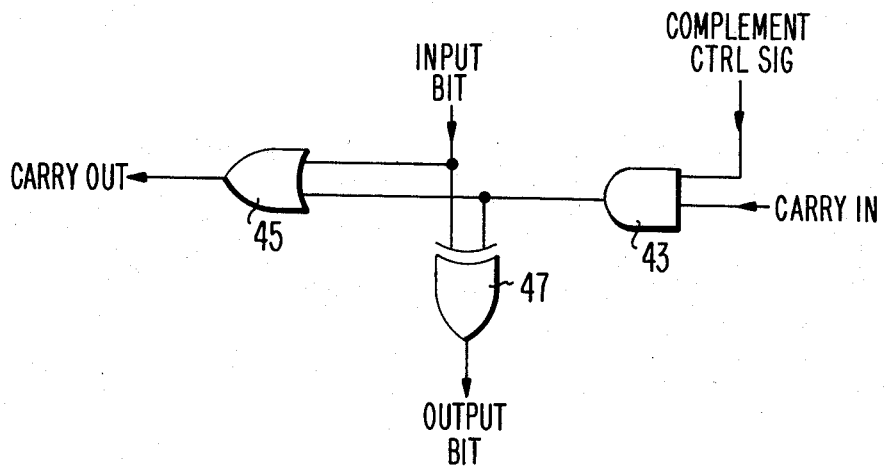
FIG. 4 is a logic diagram of a typical stage in a controlled 2's-complementer.

The 2's-complementer 31 can be constructed of stages such as shown in FIG. 4. The complement control signal (from the flip-flop 32 of FIG. 1.) is applied to an AND gate 43 which also receives the carry-in signal from the previous stage. In the first stage, or least significant bit location, there will be no carry-in so that the AND gate 43 can be eliminated for that position. The output signal from the AND gate 43 activates an OR gate 45 which produces a carry-out signal which is the carry-in signal to the next higher stage. The AND gate 43 also provides an input signal to an Exclusive-OR gate 47. The other input signal to the OR gate 45 and to the Exclusive-OR gate 47 is one of the input bits from the second accumulator. When the complement control signal, i.e., the set output signal from the flip-flop 32 is high, the output signal from the Exclusive-OR gate 47 will be the 2's-complement of the corresponding bits from the second accumulator's output.

The discontinuity shown in FIG. 2(d) between time pulses 17 and 18 is due to the particular values of the output signal from the adder 15 and the number stored in the second accumulator 16. Binary zero (0000) is represented by a D/A converter output signal of 0 volts, and binary 15 (1111), by a signal of 15 volts. Thus, binary 16 (10000), represented by a carry signal, also appears as 0 volts. By using a D/A converter that produces output signals in the range from +16 volts to −16 volts and representing zero (0000) as 0.5 volts, then binary 15 will be represented by 15.5 volts and binary 16 will produce either 0.5 volts or its complement, 15.5 volts. (The result is shown as the dotted line in FIG. 2(d). It is also within the ordinary skill of the art to implement the invention with 1's-complement arithmetic.

FIG. 2(e) shows a typical reference phase signal which is applied to a coarse phase network 101 (FIG. 1). The synthesized signal is in phase with the received signal shown in FIG. a(f). The phase difference is the difference in time between corresponding points on the phase reference signal as shown in FIG. 2(e) and the received signal as shown in FIG. 2(f). The points used are the positive zero-crossings, i.e., the points at which the value is zero when changing from a negative to a positive value. A coarse phase difference, $N_0$, is produced by the coarse phase network 101. A fine phase difference is produced by a fine phase network 102 and the phase shift signal is the difference, from a subtractor 103, of the coarse phase signal minus the fine phase signal.

Figure 5:
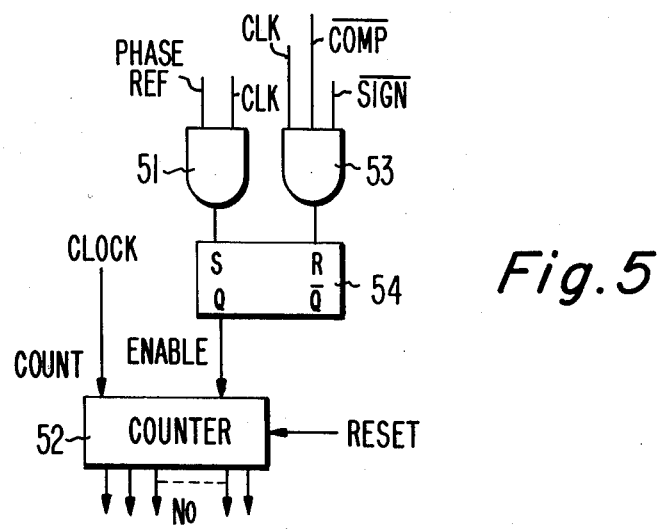
FIG. 5 is a logic diagram of an implementation of a coarse phase network.

The coarse phase output signal from the network 101 is the number of clock pulses occurring between the zero crossing of the phase reference signal and the clock pulse following the corresponding zero crossing of the synthesized signal. One embodiment of a coarse phase network 101 is shown in FIG. 5. A state-of-the-art digital counter 52 counts the clock pulses occurring while the counter 52 is enabled by the set output signal from an enabling flip-flop 54. When one of the clock pulses is concurrent with the positive zero crossing of one of the phase reference signals (because of the aforementioned ratio of clock pulses and the phase reference signal), the rising edge of the phase reference signal and the clock are detected by an AND gate 51 (using narrow apertures), the output signal from which sets the enabling flip-flop 54. The counter is then incremented by each clock pulse until the synthesized frequency cycle produces a clocked zero crossing positive signal, that is, on the rising edge of a positive synthesized frequency signal coincident with a clock signal, which is detected by an AND gate 53. The output signal from the AND gate 53 resets the enabling flip-flop 54. Because of the digitized nature of the output signal from the frequency logic network 17, the waveform is shown in FIG. 2(d) does not produce a positive zero crossing at the exact occurrence of a clock pulse. Therefore, as shown in FIG. 2(f), the coarse phase difference, $N_o$, will always be greater than the actual phase difference by a value which is equal to the value in the second accumulator 16 divided by the frequency number output value from the adder 15. Because the value from the fixed register 14 is usually several orders of magnitudes larger than the output signal from the accumulator 13, the value of the difference between the coarse phase difference $N_O$ and the actual phase difference can be represented as the quotient of the second accumulator value divided by the value in the fixed register 14. For example, if the fixed register 14 is 40 bits wide and the first accumulator 13 is 12 bits wide, the maximum values are approximately $1.1 \times 10^{12}$ and 4,095, respectively. The maximum value from the first accumulator 13 is less than four-billionths of that from the fixed register 14. Even when only half the stages of the fixed register 14 are used, the accumulator's maximum value is only four-thousandths of that of the fixed register.

The fine phase network 102 divides the output signal from the adder 15 or, as described above, the value from the fixed register 14, into the value in the second accumulator 16.

Digital (binary) division can be performed in a plurality of ways. In one technique, the divisor is repeatedly subtracted from the dividend, first aligning the divisor with the high order digits of the dividend and shifting the divisor one digit position to the right between subtractions. The quotient has a value of one each time the subtraction produces a positive or zero remainder. If the remainder is negative, the corresponding quotient bit is zero. In the latter case, the divisor may or may not be added back to the dividend. If it is, it is called restoring division; if it is not, it is called nonrestoring division. The apparatus for performing division is well documented in the art. (See, for examples, *Digital Computer and Control Engineering*, R. S. Ledley, McGraw-Hill Book Co., Inc., 1960, esp. Chaps 15 and 16; and *The Logic of Computer Arithmetic*, I. Flores, Prentice-Hall, Inc., 1963, Chaps. 3, 12–14.) Another way of performing digital division is to multiply the dividend by the reciprocal of the divisor. Properly arranged, the division process can be performed without timing circuitry, i.e., by combinatorial logic networks.

The reciprocal of a digital (binary) number can be calculated by a division process or by combinatorial logic networks. Both ways are well known in the art. The most straightforward way is the use of combinatorial logic because the result is available after the network gate propagation delays, and external clocking is not required. For the details of such a network, see, for example, "Designing a Binary Reciprocator" by J. R. Logan, *Computer Design*, May 1973, pp. 109–115.

Multiplying two digital (binary) numbers can be performed sequentially or combinatorially using cascaded logic networks. The sequential technique is well covered in the literature. (See, for examples, *Digital Computer and Control Engineering*, R. S. Ledley, McGraw-Hill Book Co., Inc., 1960, esp. Chaps. 15 and 16; and *The Logic of Computer Arithmetic*, I. Flores, Prentice-Hall, Inc., 1963, Chaps. 3, 8–11.) The use of combinatorial networks is also well known and, though usually requiring more hardware, produces the result after the propagation delays of the network gates. (See, for examples, "Multiplying Made Easy for Digital Assemblies" by C. Ghest, *Electronics*, Nov. 22, 1971, pp. 56–61; and "Parallel Multiplier Gets Boost from IC Iterative Logic" by J. Springer and P. Alfke, *Electronics*, Oct. 12, 1970, pp. 89–93.)

Figure 6:
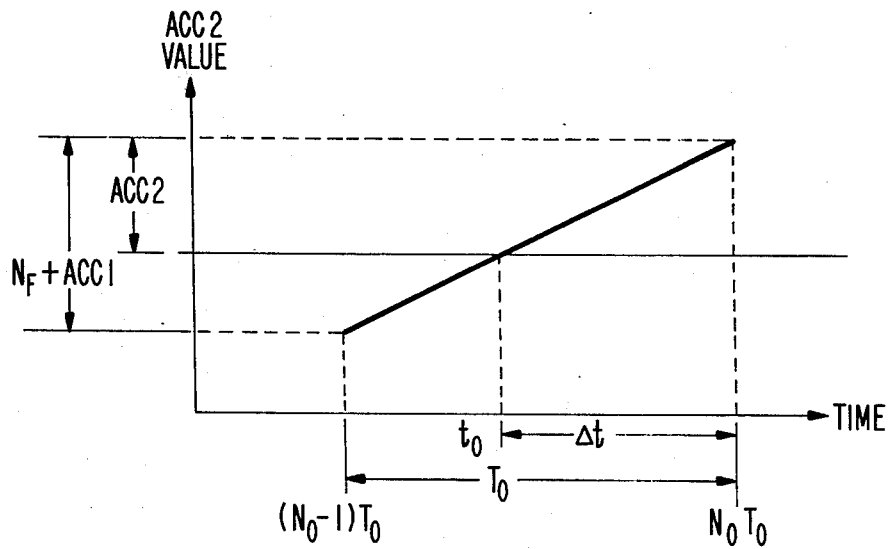
FIG. 6 is a graph showing the analog change of the value in the second accumulator with respect to time in the vicinity of the zero-crossing of the synthesized frequency.

The value resulting from the division described above, when subtracted from the output signal from the coarse phase network 101, produces an accurate measurement of the phase shift. The correction value from the fine phase network 102 is explained below using FIG. 6. In FIG. 6, the second accumulator smoothed analog value is plotted against time at the time in the vicinity of the zero crossing time, $t_o$. At time $N_o \times T_o$, where $T_0$ is the period of a clock pulse, the coarse phase measurement is $N_0$. At the previous clock pulse, i.e., $(N_0-1)T_0$, the value in the accumulator is negative. The zero (reference) value is the maximum capacity of the second accumulator 16. At the time of the true zero crossing, $t_0$, the second accumulator 16 should contain a value of zero, but because of digitization, it is only known that the zero crossing occurs between $N_0-1$ and $N_0$. The change in the accumulator value between $(N_0-1)T_0$ and $N_0T_0$ is the frequency number, that is, the output value from the adder 15. That is the number by which the second accumulator 16 is incremented by each clock pulse.

The coarse phase difference, $N_0$, is therefore larger than the true phase difference by an amount $\Delta t$. From FIG. 6, it is clear from the triangular relationships that the ratio of the output value from the adder 15 ($N_F +$ ACC1) to the time period of the clock $T_O$ is the same as the ratio of the value in the second accumulator 16 (ACC2) to the phase increment $\Delta t$. Therefore, $\Delta t$ is equal to the value in the second accumulator divided by the frequency number multiplied by the time period $T_0$, i.e., $\Delta t = T_0 \times ACC2/(N_F + ACC1)$. This value, when subtracted from the coarse phase value $N_0$ by the subtractor 103, gives an accurate phase shift measurement, viz., $\Delta\phi = T_0(N_0 - ACC2/(N_F + ACC1))$.

Various modifications to the systems and circuits described and illustrated to explain the concepts and modes of practicing the invention might be made by those of ordinary skill in the art within the principles or scope of the invention as expressed in the appended claims.

What is claimed is:

1. In a system for measuring the phase difference between a reference signal and a signal to be measured including frequency generating means for producing a generated signal at a frequency proportional to the input signal, said frequency generator means including frequency number means for storing a value designating the frequency generated and clock pulse means for producing periodic clock pulses and accumulator means for accumulating said frequency number values in response to said clock pulses, said accumulator means producing an overflow signal whenever the capacity of the accumulator is exceeded, the improvement comprising:

coarse phase means for producing a coarse phase signal value equal to the number of clock pulses occurring between a reference signal and a subsequent overflow signal from the accumulator;

fine phase means for producing a fine phase signal value equal to the quotient of the value in the accumulator means at the occurrence of said next subsequent overflow signal from the accumulator divided by the value of the frequency number means; and subtractor means for producing a phase difference value equal to said coarse phase signal value minus said fine phase signal value.

* * * * *